US009905662B2

(12) United States Patent
Loubet et al.

(10) Patent No.: US 9,905,662 B2
(45) Date of Patent: Feb. 27, 2018

(54) METHOD OF MAKING A SEMICONDUCTOR DEVICE USING A DUMMY GATE

(71) Applicant: STMICROELECTRONICS, INC., Coppell, TX (US)

(72) Inventors: Nicolas Loubet, Guilderland, NY (US); Prasanna Khare, Schenectady, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 120 days.

(21) Appl. No.: 14/976,781

(22) Filed: Dec. 21, 2015

(65) Prior Publication Data

US 2016/0104772 A1    Apr. 14, 2016

Related U.S. Application Data

(62) Division of application No. 13/906,789, filed on May 31, 2013, now abandoned.

(51) Int. Cl.
| H01L 29/08 | (2006.01) |
| H01L 29/417 | (2006.01) |
| H01L 29/66 | (2006.01) |
| H01L 29/78 | (2006.01) |
| H01L 29/165 | (2006.01) |
| H01L 27/088 | (2006.01) |
| H01L 29/49 | (2006.01) |

(52) U.S. Cl.
CPC .... *H01L 29/41791* (2013.01); *H01L 27/0886* (2013.01); *H01L 29/0847* (2013.01); *H01L 29/165* (2013.01); *H01L 29/4916* (2013.01); *H01L 29/66545* (2013.01); *H01L 29/66553* (2013.01); *H01L 29/66795* (2013.01); *H01L 29/785* (2013.01); *H01L 29/7848* (2013.01); *H01L 29/7851* (2013.01)

(58) Field of Classification Search
CPC ........... H01L 29/0847; H01L 29/66795; H01L 29/66545; H01L 29/7851; H01L 29/7848; H01L 29/165; H01L 27/0886; H01L 29/41791; H01L 29/4916; H01L 29/66553
USPC .......................................... 257/192; 438/283
See application file for complete search history.

(56) References Cited

U.S. PATENT DOCUMENTS

| 7,268,058 | B2 | 9/2007 | Chau et al. |
| 7,288,802 | B2 | 10/2007 | Anderson et al. |
| 8,110,458 | B2 | 2/2012 | Jin et al. |
| 8,310,013 | B2 | 11/2012 | Lin et al. |
| 8,445,334 | B1 | 5/2013 | Basker et al. |
| 2004/0036127 | A1 | 2/2004 | Chau et al. |
| 2006/0024874 | A1 | 2/2006 | Yun et al. |
| 2007/0287256 | A1 | 12/2007 | Chang et al. |

(Continued)

OTHER PUBLICATIONS

Meriam-Webster Definition of Single.*
Meriam-Webster Definition of Unitary.*

*Primary Examiner* — Hrayr A Sayadian
(74) *Attorney, Agent, or Firm* — Seed IP Law Group LLP

(57) ABSTRACT

A method of making a semiconductor device includes forming a fin mask layer on a semiconductor layer, forming a dummy gate over the fin mask layer, and forming source and drain regions on opposite sides of the dummy gate. The dummy gate is removed and the underlying fin mask layer is used to define a plurality of fins in the semiconductor layer. A gate is formed over the plurality of fins.

20 Claims, 8 Drawing Sheets

(56) References Cited

U.S. PATENT DOCUMENTS

| | | |
|---|---|---|
| 2008/0135949 A1 | 6/2008 | Lo et al. |
| 2008/0169472 A1 | 7/2008 | Bryant et al. |
| 2008/0265280 A1 | 10/2008 | Currie |
| 2012/0138886 A1 | 6/2012 | Kuhn et al. |
| 2012/0146112 A1 | 6/2012 | Cheng et al. |
| 2012/0252174 A1 | 10/2012 | Dutartre et al. |
| 2013/0052801 A1 | 2/2013 | Berliner et al. |

* cited by examiner

METHOD OF MAKING A SEMICONDUCTOR DEVICE USING A DUMMY GATE

FIELD OF THE INVENTION

The present invention relates to a method of making electronic devices, and more particularly, to a method of making semiconductor devices.

BACKGROUND

Semiconductor device technologies continue to evolve, providing higher chip density and operating frequencies. Fin-type field-effect transistors (FinFETs) are one type of transistor technology that is currently used to help provide desired device scaling while maintaining appropriate power consumption budgets.

A fin-type field effect transistor is a transistor that is formed with a fin of material. A fin is a relatively narrow width and relatively tall height structure that protrudes from the top surface of a semiconductor layer. The fin width is intentionally kept small to limit the short channel effect.

In a conventional FinFET, a gate conductor is positioned on the top surface of the semiconductor layer and over a portion of the fin. The gate conductor runs parallel to the top of the semiconductor layer and is perpendicular to the fin length such that the gate conductor intersects a portion of the fin. An insulator (e.g., gate oxide) separates the gate conductor from the fin. Further, the region of the fin that is positioned below the gate conductor defines a semiconductor channel region. The FinFET structure can include multiple fins, in which case the gate conductor would wrap around, as well as fill in, the space between these fins.

The fins extend across the active area of the semiconductor layer into where the raised source/drain regions are to be formed. A selective epitaxial growth/deposition process is used to form the raised source/drain regions. The raised source/drain regions typically comprise epitaxially grown silicon (Si) or silicon germanium (SiGe), for example.

More particularly, epitaxially growing Si and SiGe facets may not form a rectangular profile on a silicon substrate having a (001) crystallographic orientation with a notch aligned in a <110> direction. Facets of the fin structure may exhibit a diamond shaped profile, which often occurs in conventional processing. This makes it difficult for source/drain extension formations since diamond shaped epitaxy is difficult to drive the dopants in the channel for a good overlap.

One approach to form raised source/drain regions is disclosed in U.S. Pat. No. 8,310,013, which uses a damascene process to form the facets of the fin structure, i.e., the raised source/drain regions of the FinFET. The damascene process can be utilized to form unique and/or arbitrary profiles of the fin structure including the facets. The damascene process can utilize a capping layer that is patterned to define a desired facet profile. The capping layer can provide improved profile control. For example, the facets may be formed having a rectangular profile. Nonetheless, there is still a need for other approaches to form raised source/drain regions for a FinFET.

SUMMARY

A method of making a semiconductor device includes forming a fin mask layer on a semiconductor layer, forming a dummy gate over the fin mask layer, and forming source and drain regions on opposite sides of the dummy gate. The dummy gate may be removed and the underlying fin mask layer may then be used to define a plurality of fins in the semiconductor layer. A gate is formed over the plurality of fins.

Forming the dummy gate may comprise forming the dummy gate so that portions of the fin mask layer extend outwardly therefrom. The method may further comprise forming a dummy gate mask layer over the dummy gate, and removing the portions of the fin mask layer that extend outwardly from the dummy gate using the dummy gate mask layer.

Forming the source and drain regions may comprise forming raised source and drain regions. Removing the portions of the fin mask layer that extend outwardly from the dummy gate advantageously allows the raised source and drain regions to be more easily formed. With the fins removed from outside of the gate, the raised source and drain regions may be formed similar to bulk with comparable quality and control. This helps to enable strain techniques, such as silicon-germanium and silicon-carbon. Dopant drive-in (i.e., anneal) of the raised source and drain regions without the fins in place also allows for better source and drain extension overlap control.

The method may further comprise removing upper portions of the semiconductor layer on opposite sides of the dummy gate to define source and drain recesses, with the source and drain regions being formed in the respective source and drain recesses.

Forming the source and drain regions may comprise forming the source and drain regions of a different material than the semiconductor layer. Forming the dummy gate may comprise forming an oxide layer and a polysilicon layer thereover.

The method may further comprise forming sidewall spacers on the dummy gate. The method may further comprise optionally removing the underlying fin mask layer before forming the gate.

A semiconductor device may include a semiconductor layer, a plurality of semiconductor fins extending upwardly from the semiconductor layer and being spaced apart along the semiconductor layer, with each semiconductor fin having opposing first and second ends. A fin mask layer may be on the plurality of semiconductor fins. A gate may overlie the plurality of semiconductor fins and the fin mask layer, and have a width aligned with the opposing first and second ends of the plurality of semiconductor fins. Source and drain regions may be on opposite sides of the gate.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

A method of making a semiconductor device will now be discussed in reference to the flowchart 200 in FIG. 1 and to the process flow illustrated in FIGS. 2-11. As will be discussed in greater detail below, the fins are removed from outside of the gate so that the raised source and drain regions may be more easily formed. This helps to enable strain techniques, such as silicon-germanium and silicon-carbon. Dopant drive-in (i.e., anneal) of the raised source and drain regions without the fins in place also allows for better overlap control.

Figure 1:
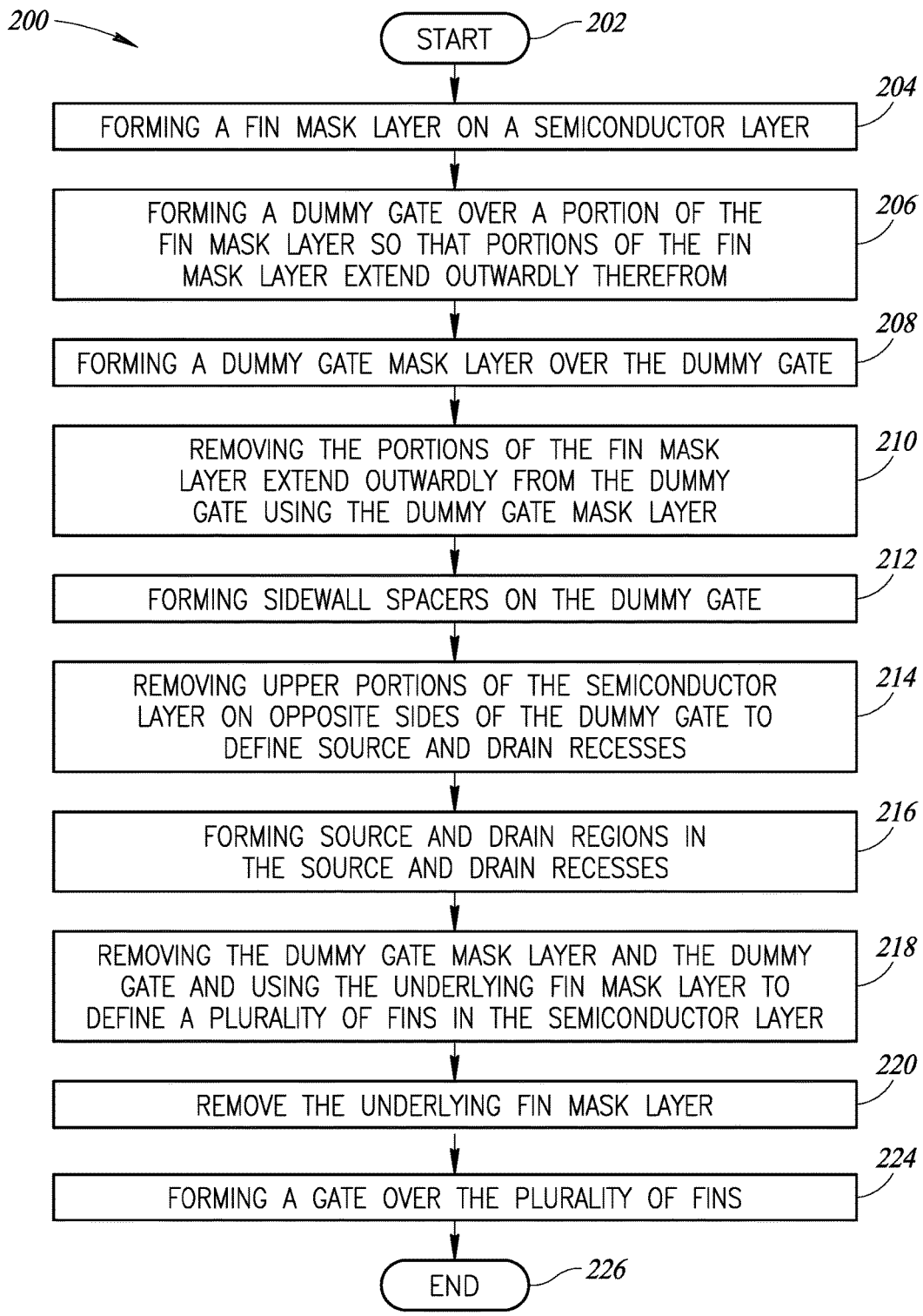
FIG. 1 is a flowchart illustrating a method for making a semiconductor device in accordance with the present embodiment.
Figure 3:
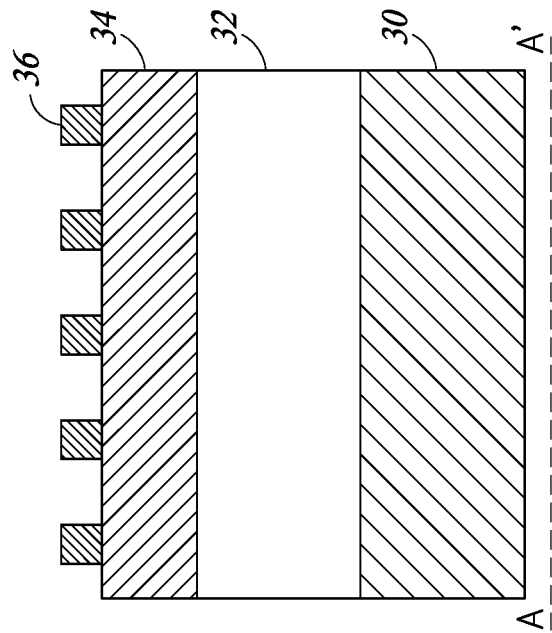
FIGS. 2 and 3 are top and cross-sectional side views showing formation of a fin mask layer on a semiconductor layer in accordance with the present embodiment.
Figure 2:
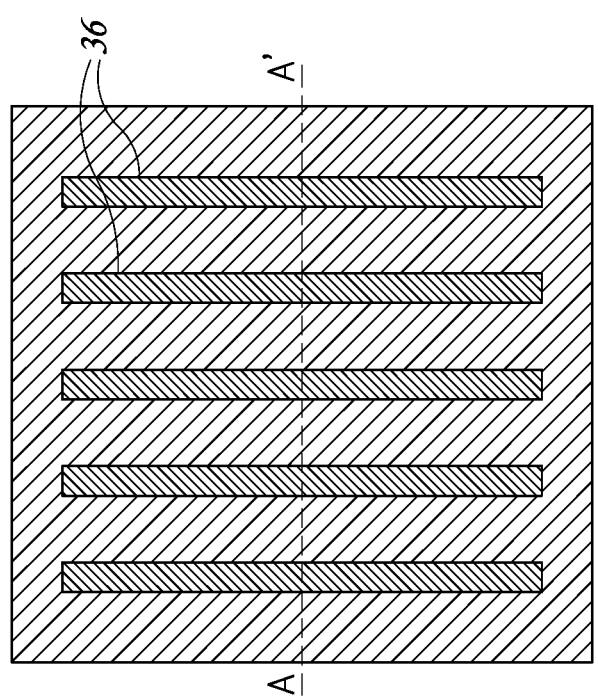

Referring initially to the flowchart 200 in FIG. 1 and to the process flow illustrated in FIGS. 2 and 3, the method includes, from the start (Block 202), forming a fin mask layer 36 on a semiconductor layer 34 at Block 204. The illustrated process flow includes forming the fin mask layer 36 across an active area of the semiconductor layer 34.

A top view of the fin mask layer 36 on the semiconductor layer 34 is illustrated in FIG. 2, and a cross-sectional side view along line AA' is illustrated in FIG. 3. The illustrated semiconductor layer 34 is on a dielectric layer 32 and is configured as a semiconductor on insulator (SOI). The dielectric layer 32 is on a semiconductor layer 30. As an example, the semiconductor layers 30 and 34 are silicon, the dielectric layer 32 is a silicon dioxide or silicon oxide, and the fin mask layer 36 is silicon nitride.

Figure 4:
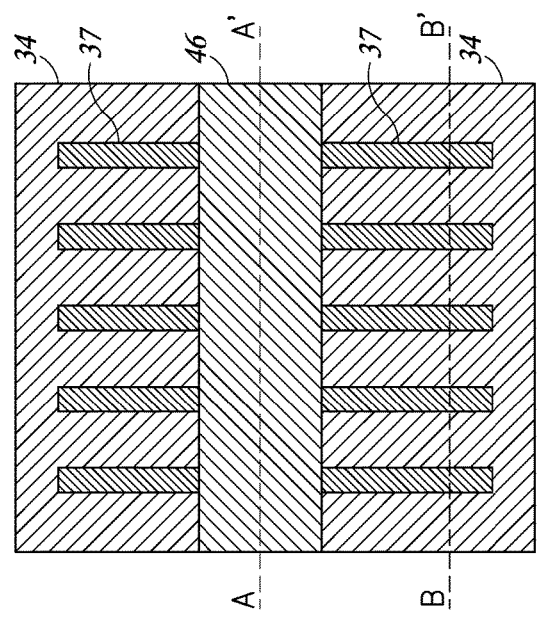

A dummy gate 44 is formed over a portion of the fin mask layer 36 at Block 206 so that portions 37 of the fin mask layer extend outwardly therefrom, as illustrated in FIG. 4. The dummy gate 44 is polysilicon, for example, and surrounds the upper and side surfaces of the fin mask layer 36. A dielectric layer 42 is between the fin mask layer 36 and the dummy gate 44. A dummy gate mask layer 46 is then formed over the dummy gate 44 at Block 208. A top view of the dummy gate mask layer 46 and dummy gate 44 over a portion of the fin mask layer 36 is illustrated in FIG. 4.

Figure 5:
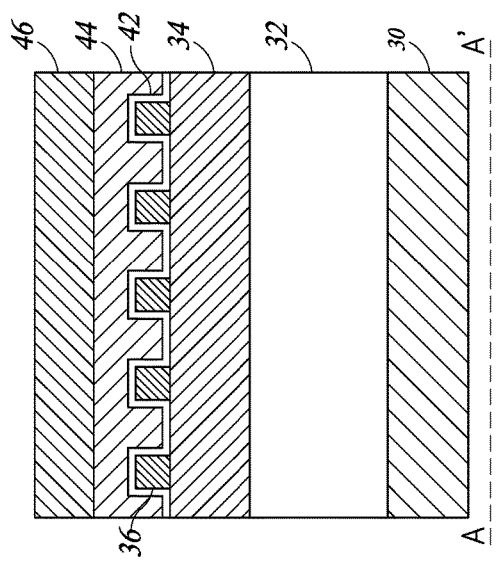
FIGS. 4, 5 and 6 are top and cross-sectional side views showing formation of a dummy gate over a portion of the fin mask layer fin shown in FIG. 2.
Figure 6:
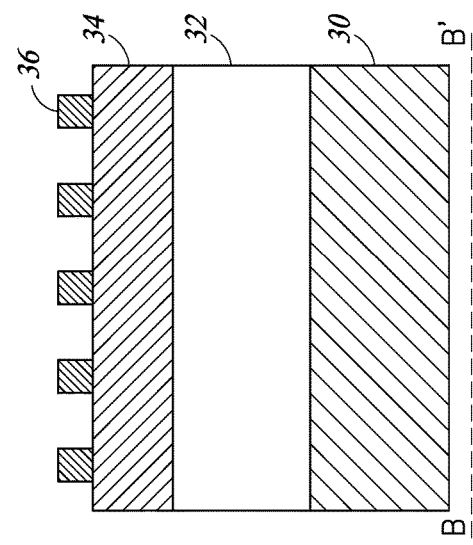

A cross-sectional side view along lines AA' through a center of the dummy gate 44 is illustrated in FIG. 5. A cross-sectional side view along lines BB' through the portions 37 of the fin mask layer 36 that extend outwardly from the dummy gate 44 is illustrated in FIG. 6. The dummy gate mask layer 46 is polysilicon, and the dielectric layer 42 is silicon dioxide, for example.

Figure 7:
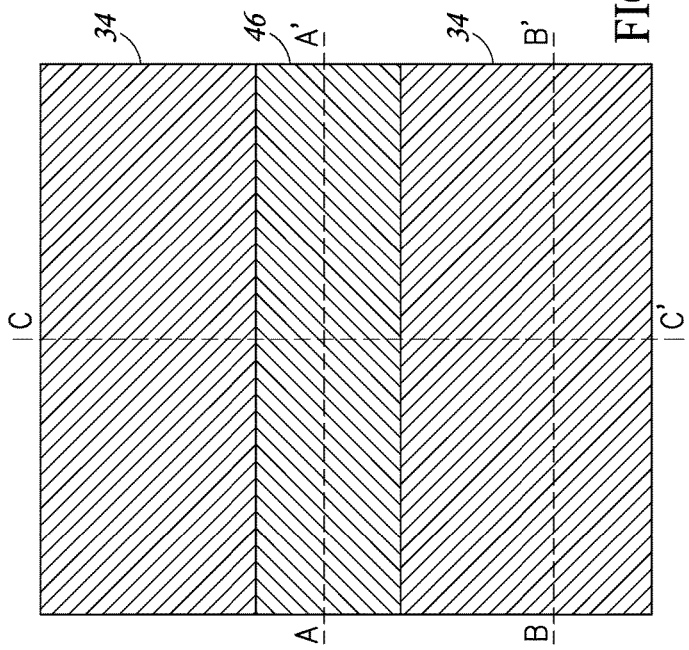
Figure 9:
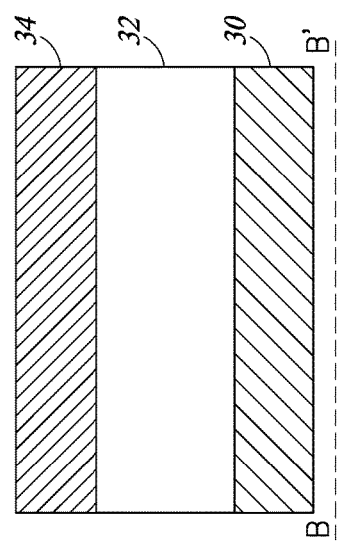
Figure 11:
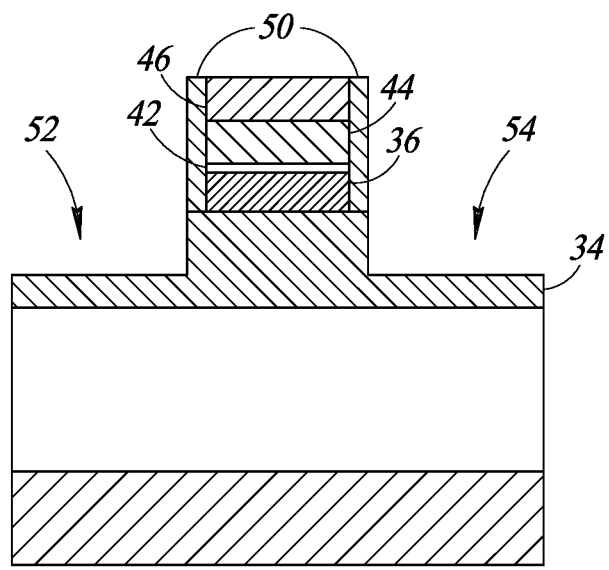
FIG. 11 is a cross-sectional side view showing sidewall spacers added to the dummy gate shown in FIG. 10, and the formation of source and drain recesses.
Figure 12:
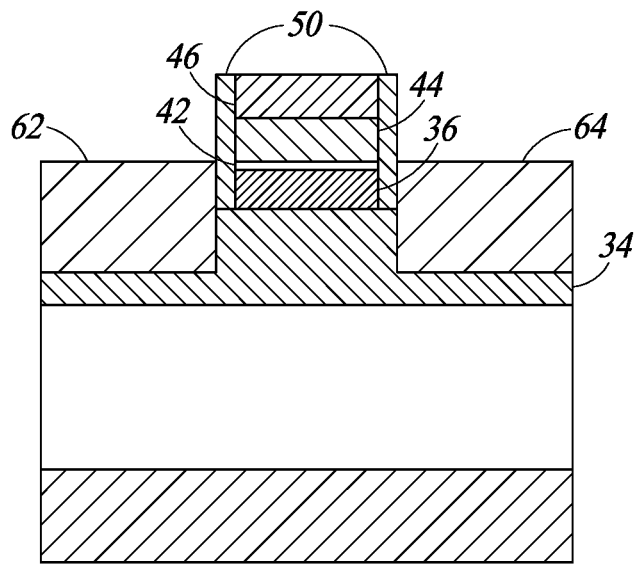
FIG. 12 is a cross-sectional side view showing raised source and drain regions formed in the source and drain recesses shown in FIG. 11.

The portions 37 of the fin mask layer 36 that extend outwardly from the dummy gate 40 are removed at Block 210 using the dummy gate mask layer 46, as illustrated in FIG. 7. A reactive ion etching (RIE) process clears the active area of the fin mask layer 36 so that silicon only is in the area where the source and drain regions are to be formed. A top view of this process is illustrated in FIG. 7.

Figure 8:
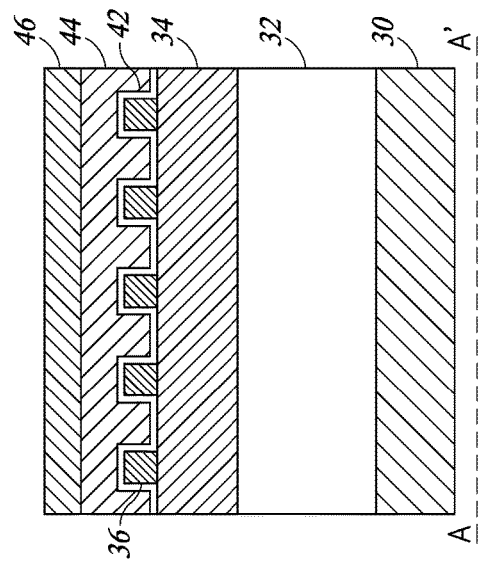
FIGS. 7, 8, 9 and 10 are top and cross-sectional side views showing removal of the portions of the fin mask layer that extend outwardly from the dummy gate shown in FIG. 4.
Figure 10:
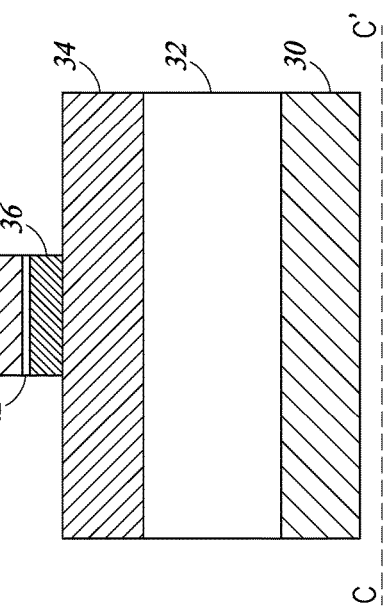

A cross-sectional side view along lines AA' through a center of the dummy gate 44 is illustrated in FIG. 7. A cross-sectional side view along lines BB' with the portions 37 of the fin mask layer 36 removed is illustrated in FIG. 8. Also, a cross-sectional side view along lines CC' through the dummy gate 44 is illustrated in FIG. 10.

Sidewall spacers 50 are formed on the dummy gate 44 at Block 212, as illustrated in 11. The sidewall spacers 50 are silicon nitride, for example, and protect the dummy gate 44 during formation of the source and drain regions. Upper portions of the semiconductor layer 34 on opposite sides of the dummy gate 44 are removed at Block 214 to define source and drain recesses 52, 54. The recesses 52, 54 are optional, but they provide better strain in the channel since the amount of material in front of the channel is increased.

Source and drain regions 62, 64 are formed at Block 216 in the source and drain recesses 52, 54. A selective epitaxial growth/deposition process is used to form the raised source and drain regions 62, 64. The raised source/drain regions 62, 64 typically comprise epitaxially grown silicon or silicon germanium, for example. In the illustrated embodiment, the raised source/drain regions 62, 64 are epitaxially grown silicon germanium.

Removing the portions 37 of the fin mask layer 36 that extend outwardly from the dummy gate 44 advantageously allows the raised source and drain regions 62, 64 to be more easily formed. The raised source and drain regions 62, 64 may now be formed similar to bulk with comparable quality and control. This helps to enable strain techniques, as readily appreciated by those skilled in the art. Dopant drive-in (i.e., anneal) of the raised source and drain regions 62, 64 without the fins in place also allows for better source and drain extension overlap control.

Figure 13:
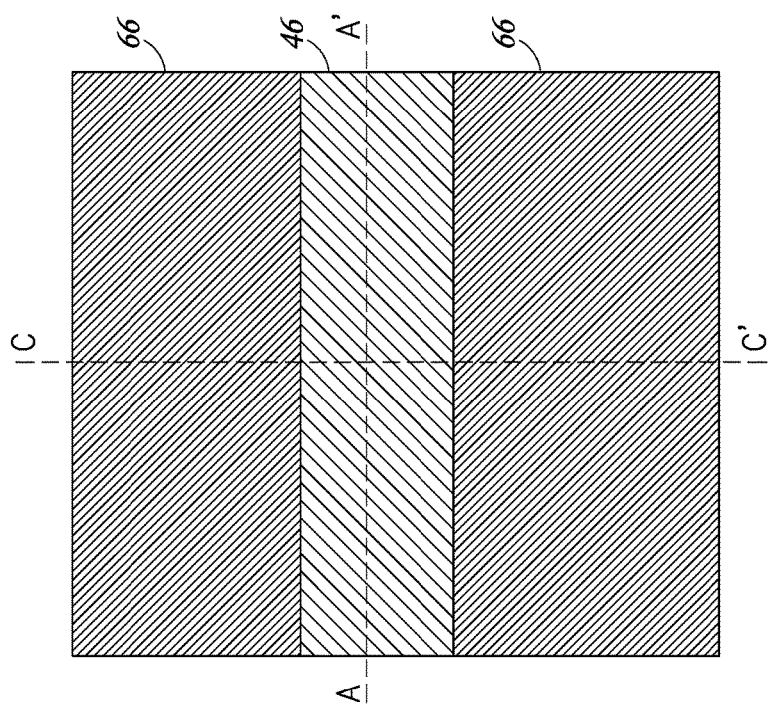

After the raised source and drain regions 62, 64 have been formed, a dielectric layer 66 is deposited, as illustrated in FIG. 13. A chemical mechanical planarization (CMP) is then performed so that an upper surface of the dielectric layer 66 is coplanar with an upper surface of the dummy gate mask layer 46.

Figure 14:
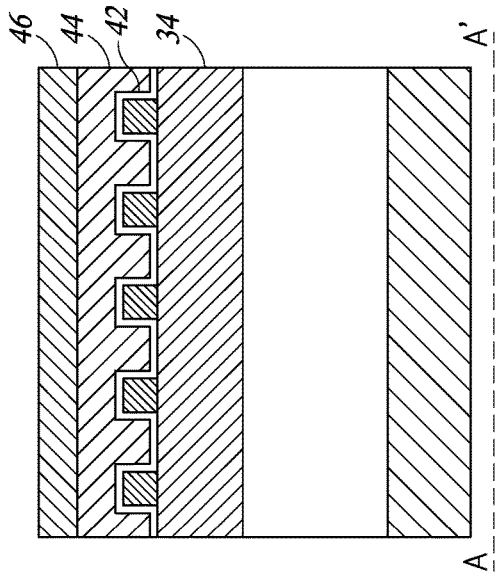
FIGS. 13, 14 and 15 are top and cross-sectional side views showing dielectric deposition and chemical mechanical planning (CMP) after forming the source and drain regions shown in FIG. 11.
Figure 15:
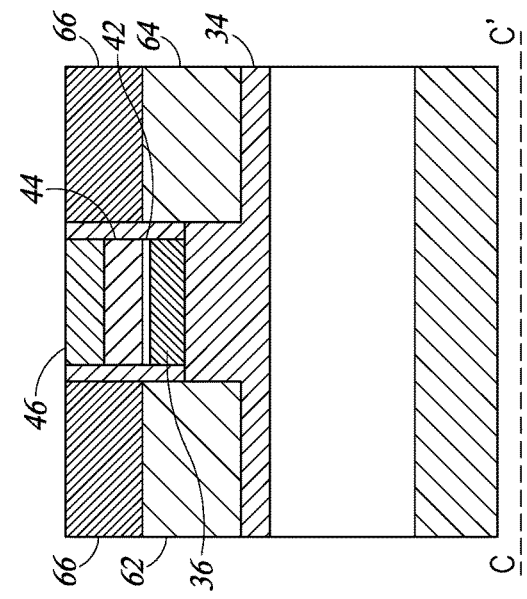

A top view after deposition and CMP of the dielectric layer 66 is illustrated in FIG. 13. A cross-sectional side view along lines AA' through a center of the dummy gate 44 is illustrated in FIG. 14. Also, a cross-sectional side view along lines BB' through the dummy gate 44 is illustrated in FIG. 15.

Figure 16:
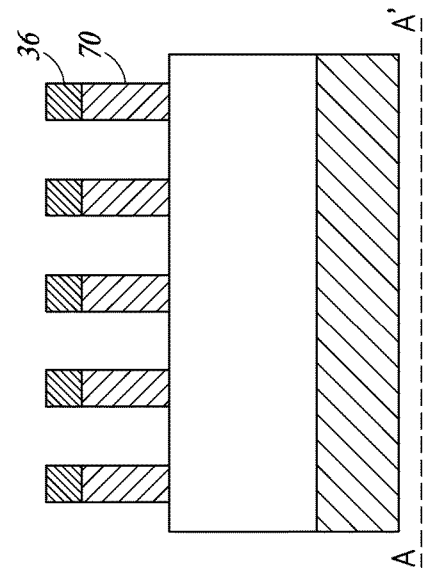
FIGS. 16, 17 and 18 are top and cross-sectional side views showing formation of the fins in the semiconductor layer using the fin mask layer shown in FIGS. 13, 14 and 15.
Figure 17:
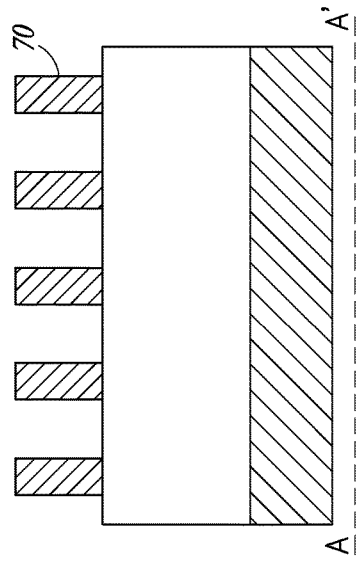
Figure 18:
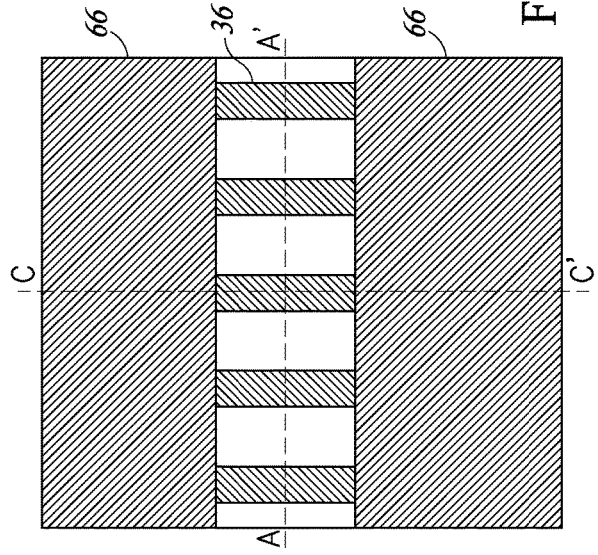
Figure 19:
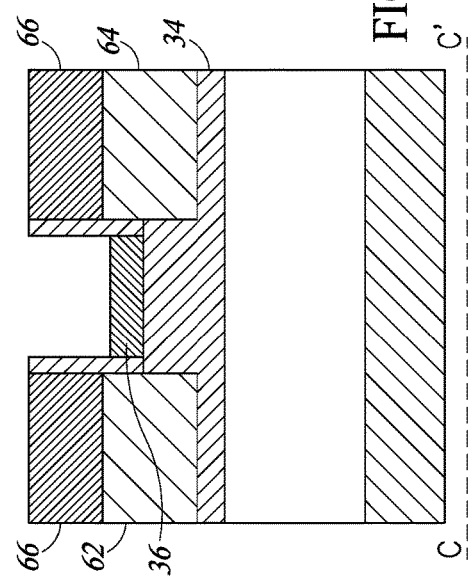
FIG. 19 is a cross-sectional side view showing removal of the fin mask layer from the fin shown in FIG. 17.

The dummy gate mask layer 46 and the dummy gate 44 are removed at Block 218 and the underlying fin mask layer 36 is used to define a plurality of fins 70 in the semiconductor layer 34, as illustrated in FIG. 17. A top view of the fins 70 underlying the fin mask layer 36 is illustrated in FIG. 16. A cross-sectional side view along lines AA' through a center of the fins 70 is illustrated in FIG. 17. Also, a cross-sectional side view along lines CC' through the fins 70 is illustrated in FIG. 18. The fin mask layer 36 may optionally be removed at Block 220, as illustrated in FIG. 19.

Figure 21:
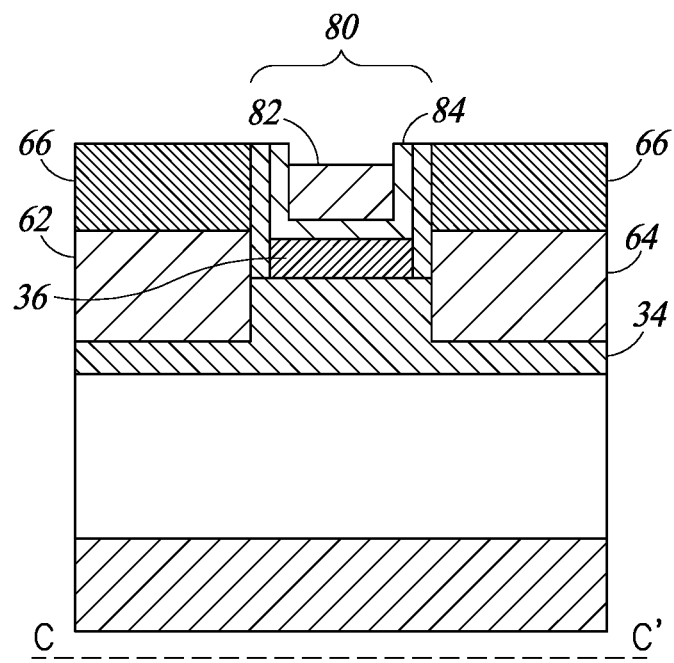

A gate 80 is formed over the plurality of fins 70 at Block 222, as best illustrated in FIG. 21. The gate 80 includes a polysilicon layer 82 on a dielectric layer 84. The method ends at Block 224.

Figure 20:
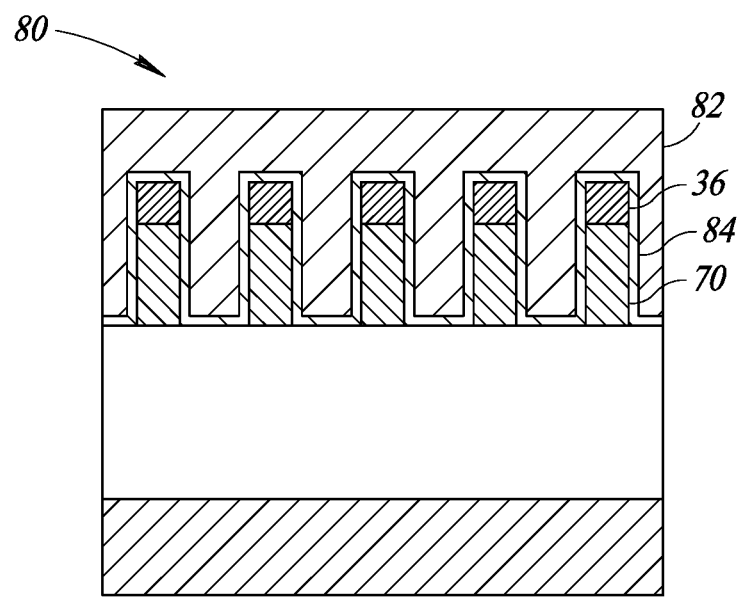
FIGS. 20 and 21 are cross-sectional side views showing the gate formed over the fins shown in FIGS. 17 and 18.

After completion of the above described process flow, a resulting semiconductor device, as best illustrated in FIGS. 20 and 21, includes a semiconductor layer 34, a plurality of semiconductor fins 70 extending upwardly from the semiconductor layer and being spaced apart along the semiconductor layer, with each semiconductor fin having opposing first and second ends. A fin mask layer 36 is on the plurality of semiconductor fins 70. The fin mask layer 36 includes a plurality of spaced apart fin mask sections, with each fin mask section on a respective semiconductor fin 70. A gate 80 overlies the plurality of semiconductor fins 70 and the fin mask layer 36, and has a width aligned with the opposing first and second ends of the plurality of semiconductor fins, as best illustrated by the top view in FIG. 16. Source and drain regions 62, 64 are on opposite sides of the gate 80.

Many modifications and other embodiments will come to the mind of one skilled in the art having the benefit of the teachings presented in the foregoing descriptions and the associated drawings. Therefore, it is understood that the disclosure is not to be limited to the specific embodiments disclosed, and that modifications and embodiments are intended to be included within the scope of the appended claims.

That which is claimed is:

1. A method of making a semiconductor device comprising:
   forming a fin mask layer on a semiconductor layer, the fin mask layer having a first portion and a second portion;
   forming a dummy gate over the first portion of the fin mask layer;
   exposing a surface of the semiconductor layer by removing portions of the semiconductor layer on opposite sides of the dummy gate;
   forming source and drain regions on the surface of the semiconductor layer on opposite sides of the dummy gate;
   removing the dummy gate;
   forming a plurality of fins in the semiconductor layer using the second portion of the fin mask layer;
   removing the second portion of the fin mask layer, the first portion of the fin mask layer remaining; and
   forming a single gate over the plurality of fins, the forming of the gate including:
      forming a dielectric layer on the first portion of the fin mask layer; and
      forming a polysilicon layer on the dielectric layer.

2. The method according to claim 1 wherein forming the dummy gate comprises forming the dummy gate so that the second portion of the fin mask layer extend outwardly away from the dummy gate.

3. The method according to claim 2 further comprising forming a dummy gate mask layer over the dummy gate.

4. The method according to claim 3 further comprising removing the second portion of the fin mask layer that extend outwardly away from the dummy gate using the dummy gate mask layer.

5. The method according to claim 1 wherein forming the dummy gate comprises forming an oxide layer and a polysilicon layer thereover.

6. The method according to claim 1 further comprising forming sidewall spacers on the dummy gate.

7. The method according to claim 1 wherein the removing of the portions of the semiconductor layer on opposite sides of the dummy gate includes forming source and drain recesses and forming the source and drain regions in the respective source and drain recesses.

8. The method according to claim 1 further comprising removing the second portion of the fin mask layer before forming the gate.

9. The method according to claim 1 wherein forming the source and drain regions comprises forming raised source and drain regions.

10. The method according to claim 1 wherein forming the source and drain regions comprises forming the source and drain regions of a different material than the semiconductor layer.

11. A method for making a semiconductor device comprising:
    forming a fin mask layer on a semiconductor layer;
    forming a dummy gate over a first portion of the fin mask layer so that a second portion of the fin mask layer extend away from the dummy gate;
    forming a dummy gate mask layer over the dummy gate;
    forming a plurality of fins in the semiconductor layer using the second portion of the fin mask layer; and
    removing the second portion of the fin mask layer that extend away from the dummy gate using the dummy gate mask layer, the first portion of the fin mask layer remaining;
    removing upper portions of the semiconductor layer on opposite sides of the dummy gate to define source and drain recesses, lower portions of the semiconductor layer remain;
    forming source and drain regions in the source and drain recesses on the lower portions of the semiconductor layer;
    forming sidewalls adjacent to the dummy gate and the first portion of the fin mask layer; and
    forming a single gate over the plurality of fins between the sidewalls, the forming of the gate including:
       forming a dielectric layer on the first portion of the fin mask layer; and
       forming a polysilicon layer on the dielectric layer.

12. The method according to claim 11 wherein forming the dummy gate comprises forming an oxide layer and a polysilicon layer thereover.

13. The method according to claim 11 further comprising removing the second portion of the fin mask layer before forming the gate.

14. The method according to claim 11 wherein forming the source and drain regions comprises forming raised source and drain regions.

15. The method according to claim 11 wherein forming the source and drain regions comprises forming the source and drain regions of a different material than the semiconductor layer.

16. A method of making a semiconductor device comprising:
    forming a fin mask layer on a semiconductor layer having a first portion and a second portion;
    forming a dummy gate over the first portion of the fin mask layer;
    forming source and drain regions on opposite sides of the dummy gate;
    removing the dummy gate;
    forming a plurality of fins in the semiconductor layer using the second portion of the fin mask layer; and
    forming a unitary gate over the plurality of fins, the forming of the unitary gate over the plurality of fins including:

forming a dielectric layer on the first portion of the fin mask layer; and forming a polysilicon layer on the dielectric layer.

17. The method according to claim 16 wherein forming the dummy gate comprises forming the dummy gate so that the second portion of the fin mask layer extend outwardly away from the dummy gate.

18. The method according to claim 17 further comprising forming a dummy gate mask layer over the dummy gate.

19. The method according to claim 18 further comprising removing the second portions of the fin mask layer that extend outwardly from the dummy gate using the dummy gate mask layer.

20. The method according to claim 16 wherein forming the dummy gate comprises forming an oxide layer and a polysilicon layer thereover.

\* \* \* \* \*